United States Patent
Nagata et al.

(10) Patent No.: US 6,409,965 B1
(45) Date of Patent: Jun. 25, 2002

(54) SPUTTERING TARGET AND ITS MANUFACTURING METHOD

(75) Inventors: Takahiro Nagata; Manabu Sasaki; Hitoshi Kimura; Norio Yokoyama, all of Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/666,241

(22) Filed: Sep. 21, 2000

(30) Foreign Application Priority Data

Sep. 21, 1999 (JP) .......................................... 11-267136

(51) Int. Cl.$^7$ .......................... C22C 32/00; C22C 1/00; C22C 14/34; B22F 1/00
(52) U.S. Cl. ...................... 419/26; 420/540; 148/514; 419/6; 419/10; 419/66; 204/298.13
(58) Field of Search ...................... 204/298.13; 148/301, 148/514; 420/416, 590; 419/66, 6, 10, 26

(56) References Cited

U.S. PATENT DOCUMENTS 6,071,323 A * 6/2000 Kawaguchi .................. 75/246

* cited by examiner

Primary Examiner—Steven H. VerSteeg
(74) Attorney, Agent, or Firm—Sonnenschein, Nath & Rosenthal (57) ABSTRACT

An ingot is made from a used target of 30 weight % or more, and new metals of the same components, and recycled alloy powder is made by a gas atomizing process. Magnetic permeability is controlled not to exceed 2 by adjusting the content of rare earth metals in rare earth alloy powder to be at least 35 weight %. By blending the recycled alloy powder with other powder to produce alloy powder containing at least 50 weight % of rare earth alloy powder having a magnetic permeability not higher than 2 and containing at least 65 weight % of rare earth alloy powder. By sintering the alloy powder under pressure and thereafter cutting top, bottom and side surfaces of the sintered material, a target having a magnetic permeability not higher than 2 and having a thickness not less than 8 mm is fabricated.

9 Claims, 5 Drawing Sheets

SPUTTERING TARGET AND ITS MANUFACTURING METHOD

BACKGROUND OF THE INVENTION

1. Field of the Invention

This invention relates to a sputtering target and its manufacturing method especially suitable for application to an alloy target used for sputtering in a manufacturing process of a magneto-optical recording medium.

2. Description of the Related Art

For years, price strategies have been important in the field of AV recording mediums such as mini discs (MDs) intended for general customers, and reduction of prices has been demanded continuously. To meet the demand for price reduction of mediums, reduction of manufacturing costs of mediums has been required. Regarding cost reduction of mediums, thickness of targets used for fabrication of recording materials of mediums is an important factor.

That is, for manufacturing a medium, magnetron sputtering, among others, is used for stacking its recording material. For deposition of the recording medium by magnetron sputtering, a target containing the recording material is used. Such a target includes as its major component a rare earth element which is a rare element and expensive. Conventionally, however, only 30% to 50% of the target was sputtered and contributed to deposition of the film, and the remainder of the target was abandoned. Therefore, it has been demanded to increase the ratio of a target actually sputtered and contributing deposition of a film by increasing the thickness of the target.

However, targets conventionally used for manufacturing mediums had magnetic permeability around 5. Therefore, the maximum thickness of a target enabling stable discharge of plasma and sputtering was about 8 mm.

Under the circumstances, various researches and developments have been made toward fabrication of targets having a thickness of 8 mm or more, and various proposals were presented.

For example, there was proposes a technique for manufacturing a target made by hot-pressing alloy powder obtained by mechanical crushing and having a magnetic permeability not exceeding 3 (Japanese Patent Laid-Open Publication No. hei-10-251847 (Literature 1)). Literature 1 teaches a method for manufacturing a magneto-optical recording alloy target made by hot-pressing alloy powder made by mechanical crushing and having a magnetic permeability not exceeding 3, and a method for manufacturing a magneto-optical recording alloy target made by mechanically crushing used targets into alloy powder and mixing it with new alloy powder and having a magnetic permeability not exceeding 3.

Literature 1 also teaches that a target having a low magnetic permeability, low containment of oxygen, single-sintered structure of a rare earth metal and a transition metal, and a thickness not less than 8 mm can be made by dissolving a source material and used targets, then making a quickly cooled alloy, and mechanically crushing the quickly cooled alloy into alloy powder.

However, the Inventor conducted various experiments concerning alloy powder as taught by Literature 1, and found that the alloy powder described in Literature contained an unacceptably large amount of metal impurities for practical use.

For example, there was proposed a technique for manufacturing a target made by hot-pressing alloy powder obtained by mechanical crushing and having a magnetic permeability not exceeding 3 (Japanese Patent Laid-Open Publication No. hei-10-251847 (Literature 1)). Literature 1 teaches a method for manufacturing a magneto-optical recording alloy target made by hot-pressing alloy powder made by mechanical crushing and having a magnetic permeability not exceeding 3, and a method for manufacturing a magneto-optical recording alloy target made by mechanically crushing used targets into alloy powder and mixing it with new alloy powder and having a magnetic permeability not exceeding 3.

The magneto-optical recording alloy target having a magnetic permeability not larger than 3, which is disclosed in Literature 1, also involves the problem that a sufficient leak magnetic flux cannot be obtained in any magnetron sputtering apparatus, and sputtering of this target is impossible.

That is, although the Inventor made a target having the magnetic permeability of 2.1 and the thickness of 10 mm from alloy powder as taught by Literature 1, and tried sputtering by setting this target in place of a sputtering apparatus, it could not sputter this target.

Furthermore, although Literature 1 does not teach a magneto-optical recording alloy target having a magnetic permeability not larger than 2.3, according to the Inventor's knowledge, a 10 mm thick target having a magnetic permeability around 2.3 as taught by Literature 1 cannot be sputtered.

OBJECTS AND SUMMARY OF THE INVENTION

It is therefore an object of the invention to provide a sputtering target and its manufacturing method enabling effective use of expensive rare earth metals, not adversely affecting the environment, contributing to reduction of the manufacturing cost, and ensuring a target with a magnetic permeability low enough for sputtering.

The Inventor made researches toward solution of the above-indicated problems involved in the conventional techniques. A summary thereof is shown below.

According to the Inventor's knowledge, in order to effective use an expensive rare earth metal for fabricating a target whose thickness is not less than 10 mm, it is desirable to produce recycled alloy powder by using used targets, and fabricate new targets by using the recycled alloy powder. So, the Inventor conducted various experiments regarding rare earth alloy power containing recycled alloy powder.

The Inventor first made reviews about theoretic density ratios of targets fabricated. According to the Inventor's knowledge, rare earth alloy powder is very readily oxidized, and if a target substantially made of rare earth alloy powder has a low theoretic density ratio, oxidation of the target itself progresses. Therefore, any medium made by using this target cannot have a satisfactory property. Relation between deposition rate in a sputtering process and target lifetime is shown in FIG. 1, taking two different cases where the theoretic density ratio of the target is 95% and 97%, respectively.

Figure 1:
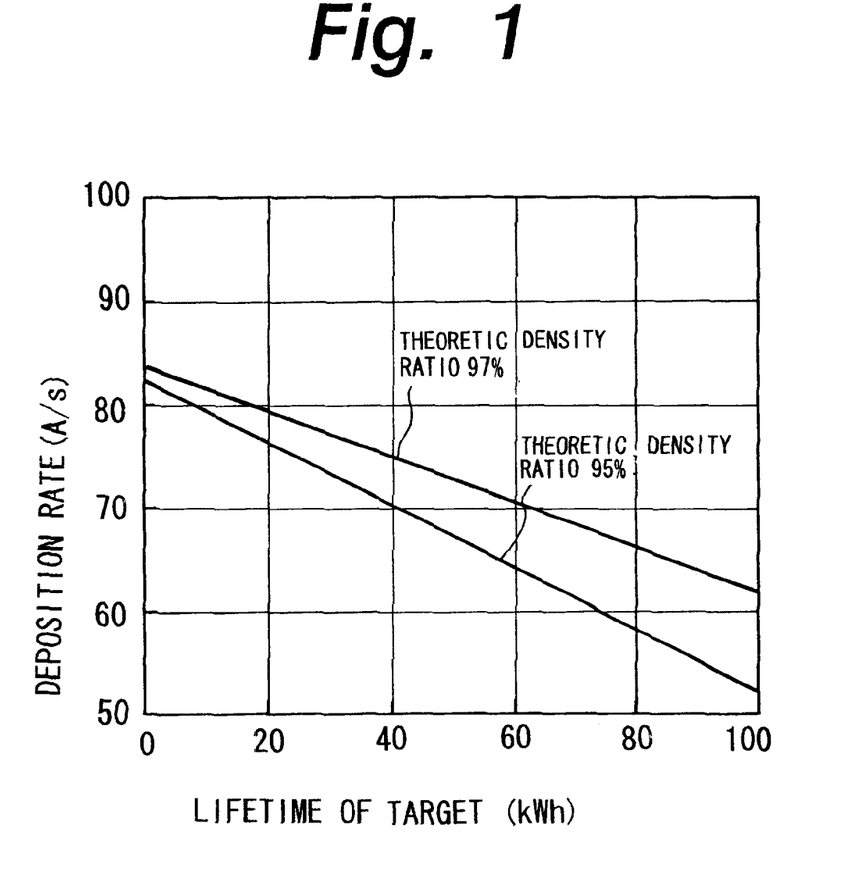
FIG. 1 is a graph showing relation between deposition rate and target lifetime in a sputtering process according to the invention.

It is apparent from FIG. 1 that, when the theoretic density ratio is high, i.e. 97%, fluctuation in deposition rate of sputtering is small. In other words, if thickness of the target is constant, the target lifetime is longer, and the manufacturing cost of mediums can be reduced when the theoretic density ratio is high.

Therefore, it is preferable for a target to have a theoretic density ratio not lower than 95%, and more preferably not lower than 97%. Discussion is continued below, selecting the case of the theoretic density ratio not lower than 97%.

For the purpose of determining composition of rare earth alloy powder, the Inventor conducted an experiment about dependency of magnetic permeability of rare earth alloy powder upon quantity of rare earth metals contained in rare earth alloy powder. A result of the experiment is shown in FIG. 2.

Figure 2:
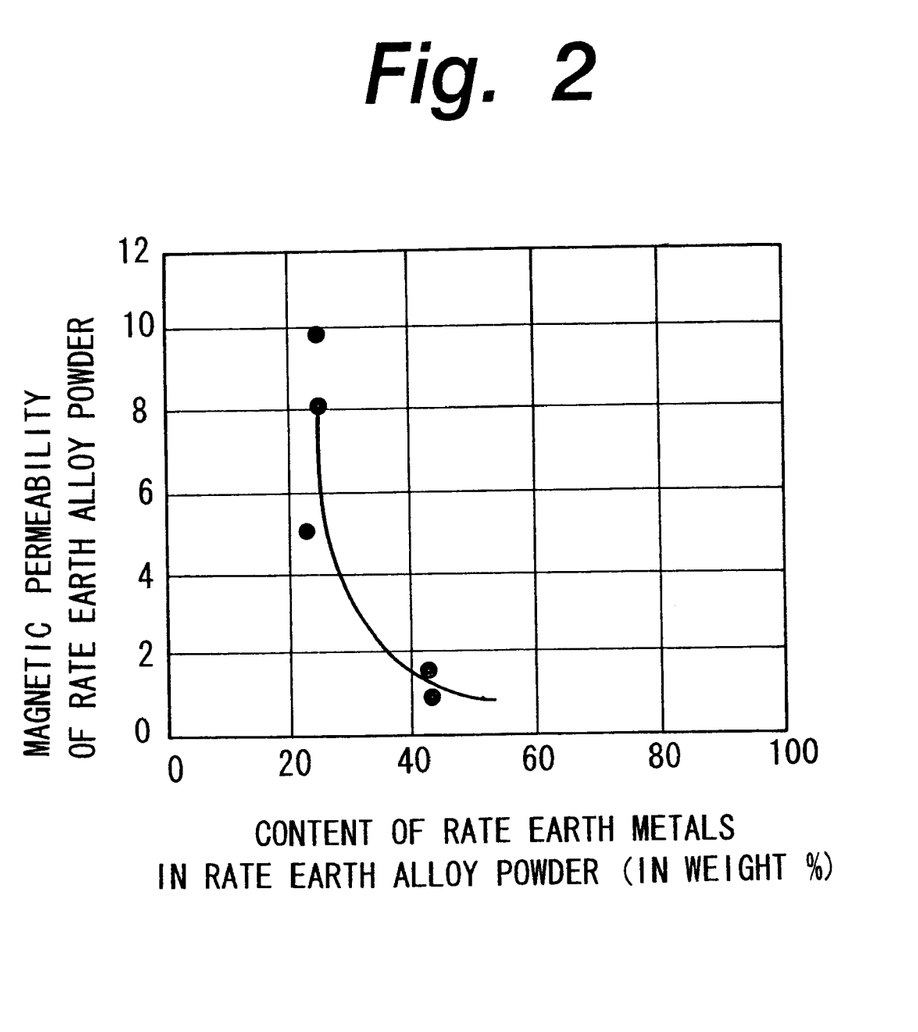
FIG. 2 is a graph showing dependency of magnetic permeability of rare earth alloy powder used for manufacturing a target upon content of rare earth metals.

It apparent from FIG. 2 that magnetic permeability of rare earth alloy powder is 5 or higher when it contains about 20 weight % of rare earth metals, but decreases to 2 or lower when the content of earth metals therein is 35 weight % or higher. Therefore, in order to maintain a magnetic permeability not higher than 2 in rare earth alloy powder, the content of rare earth metal in the rare earth alloy powder is preferably not lower than 35 weight %, and more preferably not lower than 40 weight %.

Figure 3:
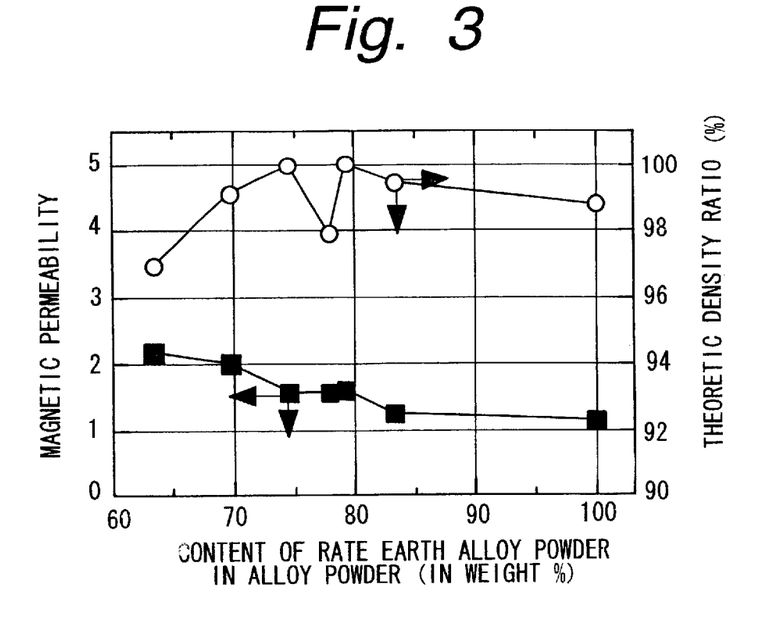
FIG. 3 is a graph showing dependency of magnetic permeability and theoretic density ratio of a target according to the invention upon content of rare earth alloy powder in alloy powder.

The Inventor also conducted an experiment about magnetic permeability and theoretic density ratio of targets upon rare earth alloy powder contained in alloy powder, using targets prepared by using rare earth alloy powder. A result of the experiment is shown in FIG. 3. In FIG. 3, values of magnetic permeability of targets are plotted with ■ whereas values of theoretic density ratio are plotted with ○.

It is apparent from FIG. 3 that permeability of targets is larger than 2 when the content of rare earth alloy powder in alloy powder is less than 65 weight %, and becomes 2 or less when the content of the rare earth alloy powder in alloy powder is not less than 65 weight %, or preferably not less than 70 weight %, taking errors into account.

Thus, content of rare earth alloy powder in alloy powder as the source material of a target should be not less than 65 weight %, and more preferably not less than 70 weight %.

Figure 4:
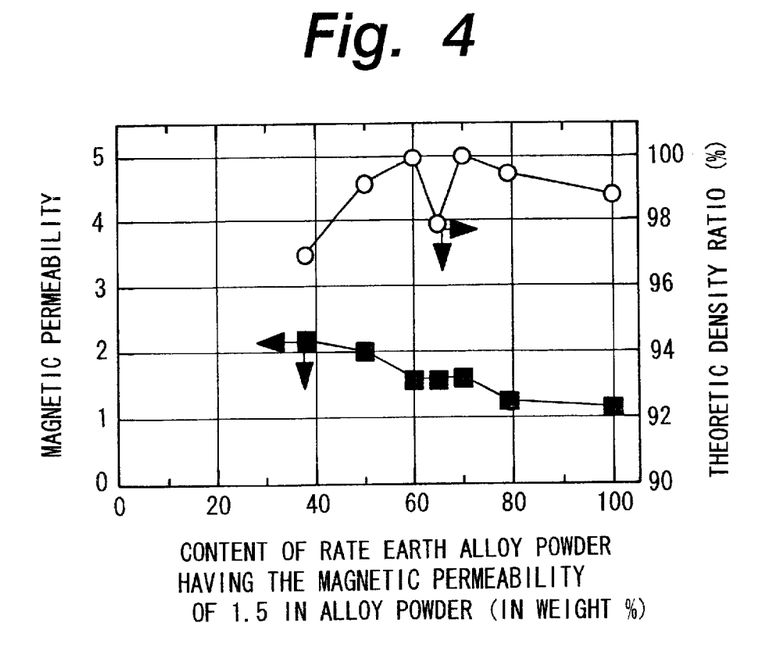
FIG. 4 is a graph showing dependency of magnetic permeability and theoretic density ratio of a target according to the invention upon content of rare earth alloy powder having a magnetic permeability not larger than 2 in alloy powder.

The Inventor also conducted an experiment about magnetic permeability and theoretic density ratio of targets. FIG. 4 shows dependency of magnetic permeability and theoretic density ratio of targets upon content of rare earth alloy powder in alloy powder, when magnetic permeability of the rare earth alloy powder is controlled not to exceed 2 (more specifically around 1.5). In FIG. 4, values of magnetic permeability of targets are plotted with ■ whereas values of theoretic density ratio are plotted with ○.

It is apparent from FIG. 4 that magnetic permeability of targets becomes larger than 2 when amount of rare earth alloy powder, having a magnetic permeability not larger than 2, contained in alloy powder used as the source material of targets is less than 50 weight %, and becomes 2 or less when 50 weight % or more.

Therefore, content of rare earth alloy powder having a magnetic permeability not higher than 2 in alloy powder used as the source material of targets is preferably controlled not to be lower than 50 weight %.

Through those various experiments and researches, the Inventor has come to know that, in order to control magnetic permeability of a target not to exceed 2 while using recycled alloy powder, it is necessary to control the content of rare earth alloy powder including recycled alloy powder contained in alloy powder used as the source material of the target not to exceed 65 weight %.

The invention has been made through those researches and accompanying experiments.

According to the first aspect of the invention, there is provided a sputtering target made of alloy powder which contains at least 65 weight percent of at least one kind of rare earth alloy powder made of at least one kind of rare earth element and at least two kinds of elements selected from the group consisting of Fe, Co, Ni, Cr and Si, and contains at least one kind of recycled alloy powder prepared by using a target used at least once for sputtering.

In the first aspect of the invention, magnetic permeability of the target is typically a value not larger than 2.

In the first aspect of the invention, thickness of the target ensuring a sufficient leak magnetic flux intensity and enabling sputtering is typically not less than 8 mm and not more than 20 mm, or preferably not less than 10 mm and not more than 15 mm.

According to the second aspect of the invention, there is provided a manufacturing method of a sputtering target which manufactures a target from alloy powder which contains at least 65 weight percent of at least one kind of rare earth alloy powder made of at least one kind of rare earth element and at least two kinds of elements selected from the group consisting of Fe, Co, Ni, Cr and Si, and contains at least one kind of recycled alloy powder prepared by using a target used at least once for sputtering.

In the second aspect of the invention, for the purpose of ensuring a practical level of the content of metal impurities in the alloy powder used for making the target, the recycled alloy powder is prepared by powdering by an atomizing method an ingot prepared by a target used at least once for sputtering and a material not used before for making a target. From the standpoint of making fine powder minimized in composition segregation, typically used as the atomizing method is a gas atomizing method. However, a single-roll method or a centrifugal disc method is also usable.

In the present invention, recycled alloy powder is a substance obtained by powdering an ingot prepared from a target used at least once for sputtering, and a new material not used before for making a target. In the present invention, recycled alloy powder typically contains rare earth alloy powder prepared from a target used at least once for sputtering by 30 weight % or more, or preferably by 50 weight % or more.

In the present invention, a rare earth element is the generic name of lanthanoids, Sc (scandium) and Y (yttrium) to lanthanoids. More specifically, it is the general name of La (lanthanum, Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), Lu (lutetium), Y and Sc.

In the present invention, alloy powder typically contains 50 weight % or more of rare earth alloy powder having a magnetic permeability not larger than 2. In order to control the magnetic permeability of the rare earth alloy powder not to exceed 2, content of rare earth metal in the rare earth alloy powder is typically not less than 30 weight %, and preferably not less than 35 weight %.

In the present invention, in order to make a target having a magnetic permeability not larger than 2, magnetic permeability of alloy powder is controlled not to exceed 2.

In the present invention, content of metal impurities in the target is typically not more than 0.1 weight %, and content of metal impurities in the alloy powder is not more than 0.1 weight %.

In the present invention, theoretic density ratio of the target is typically not less than 97%, and preferably not less than 98%.

In the present invention, the sputtering apparatus using the target is typically a magnetron sputtering apparatus.

However, the target can be made in any other sputtering apparatus, such as opposed-electrodes sputtering apparatus, electron cyclotron resonance (ECR) sputtering apparatus, high-frequency sputtering apparatus, reactive sputtering apparatus, bias sputtering apparatus, collimate sputtering apparatus or long-distance (LD) sputtering apparatus.

In the present invention, the sputtering target is preferably made of alloy powder which contains at least one kind of rare earth alloy powder selected from the group consisting of FeTbCo, FeTbCr, FeTbCoCr, FeGdCo, FeDyCo and FeGdCoSi by 65 weight % or more, and containing at least one kind of recycled alloy powder prepared by using a target which is made of at least one kind of rare earth alloy selected from the group consisting of FeTbCo, FeTbCr, FeTbCoCr, FeGdCo, FeDyCo and FeGdCoSi used at least once for sputtering.

According to the sputtering target and its manufacturing method having the above summarized structures according to the invention, since the sputtering target is made of alloy powder which contains at least one kind of rare earth alloy powder made of at least one kind of rare earth element and at least two kinds of elements selected from the group consisting of Fe, Co, Ni, Cr and Si, and contains at least one kind of recycled alloy powder prepared from a target used at least once for sputtering, the sputtering target can be lowered in magnetic permeability, and increased in thickness.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings. In all figures illustrating the embodiments, the same or equivalent parts or elements are labeled with common reference numerals.

First explained is a manufacturing method of a sputtering target according to the first embodiment of the invention.

In the sputtering target manufacturing method according to the first embodiment, a target of a quaternary FeTbCoCr alloy used at least once for magnetron sputtering and new metals which are the same metals (Fe, Tb, Co, Cr) composing the quaternary alloy are blended to contain the used target by 30 weight % or more, such as 50 weight %, for example, in the first embodiment, and an ingot is made therefrom in a vacuum melting furnace (not shown). As explained later, this ingot is processed into recycled alloy powder containing rare earth alloy powder such that the content of rare earth metals in the rare earth alloy powder forming the recycled alloy powder is at least 35 weight %, such as 42 weight %, for example, in the first embodiment.

After that, the ingot is powdered in an inactive gas atmosphere like argon (Ar) gas by a gas atomizing process to prepare recycled alloy powder of FeTbCoCr alloy. Magnetic permeability of this recycled alloy powder has been confirmed to be 1.5 by measurement. A gas atomizing apparatus used for the gas atomizing process is explained below.

Figure 5:
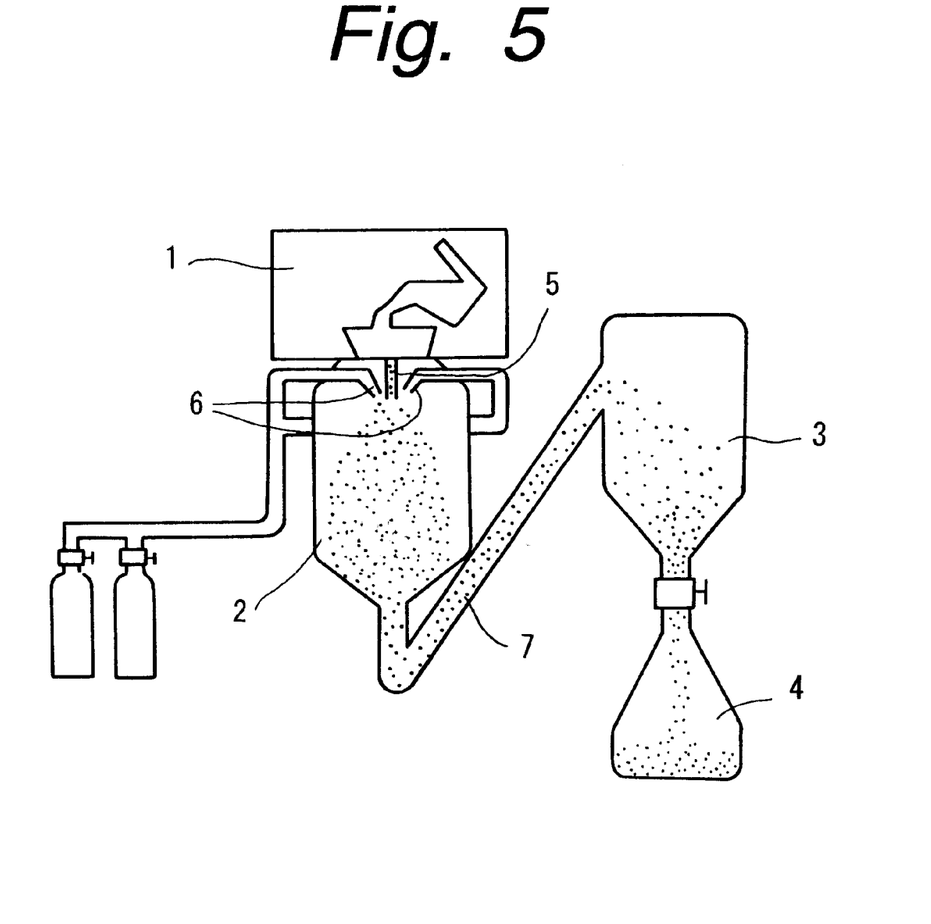
FIG. 5 is a diagram roughly showing configuration of a gas atomizing apparatus for preparing recycled alloy powder according to the invention.

As shown in FIG. 5, the gas atomizing apparatus according to the invention includes a vacuum melting furnace 1, granulating chamber 2, cyclone 3 and container 4 which are connected in sequence.

The vacuum melting furnace 1 is a furnace for melting materials by high-frequency induction heating, for example. A nozzle 5 is provided directly under the vacuum melting furnace 1, and a gas inlet 6 for jetting a gas is provided neat the nozzle 5.

The granulating chamber 2 is a processing chamber for powdering a material molten in the vacuum melting furnace 1 by spraying it in form of fine mist and thereby preparing a powder material. The cyclone 3 and the container 4 are used for storing a powdered material.

By using the gas atomizing apparatus having the above-explained configuration, recycled alloy powder of FeTbCoCr alloy is prepared.

That is, an ingot prepared from the used target and new metals of the same components is melted in the vacuum melting furnace 1. After that, the molten material of the used target is continuously sprayed into the granulating chamber 2 from the vacuum melting furnace 1 through the nozzle 5, and an inactive gas such as Ar gas, for example, is jetted into the granulating chamber 2 through the gas inlet 6. As a result, the molten material form fine mist.

Thereafter, the molten material in form of fine mist is quickly cooled and powdered into recycled alloy powder 7 while it falls down. Then, the recycled alloy powder 7 is introduced into the cyclone 3. Thereafter, the recycled alloy powder 7 falls from the cyclone 3 into the container 4 and is stored there. Grain size and grain size profile of the globular grains 7 is controlled taking account of the temperature of the molten material, flow rate of the molten material from the nozzle 5, nozzle diameter, flow rate of the jetted inactive gas, and so forth. After that, the recycled alloy powder 7 is classified to form an optimum grain size profile.

After that, the recycled alloy powder 7 is blended with powder containing Fe, Tb, Co and Cr, for example, and by dry mixture thereof in an Ar gas atmosphere, alloy powder for manufacturing the target is prepared. Respective materials of this alloy powder are blended such that the alloy powder contains rare earth alloy powder by at least 65 weight %, or preferably by at least 70 weight %, and rare earth alloy powder having a magnetic permeability not larger than 2 by at least 50 weight %. In this first embodiment, the alloy powder is prepared to contain 80 weight %, for example, of recycled alloy powder having a magnetic permeability of 1.5 and contain another material as its remainder part, which is adjusted to make a predetermined target composition. Namely, they are blended to enable fabrication of a target containing 66 atomic % of Fe, 24 atomic % of Tb, 7 atomic % of Co and 3 atomic % of Cr. As a result, mixed powder satisfying the above-indicated requirements is prepared.

Subsequently, using this mixed powder, the sputtering target is manufactured.

Figure 6A:
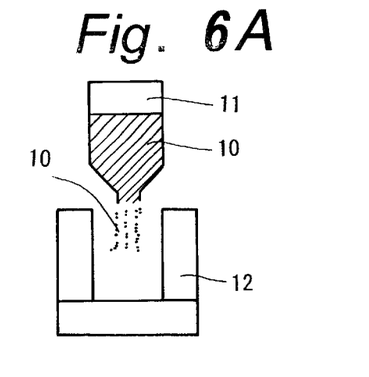
FIGS. 6A through 6D are diagrams for explaining a compression sintering process for manufacturing a target according to the invention.
Figure 6B:
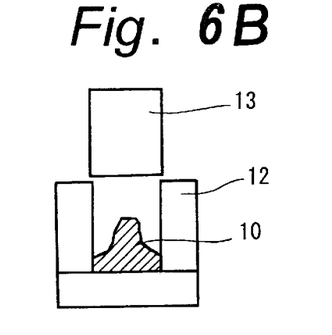
Figure 6C:
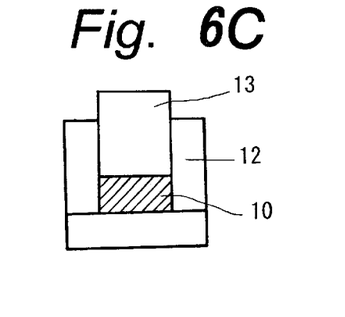
Figure 6D:
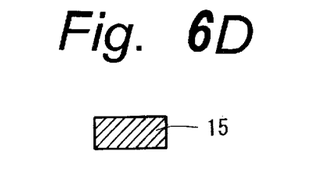

That is, first as shown in FIG. 6A, using a container 11 storing mixed powder 10, the mixed powder 10 is supplied into a carbon mold 12 from above it. Next, as shown in FIG. 6B, a compression punch rod 13 is inserted into the carbon mold 12 from above the carbon mold and the mixed powder 10 supplied therein. After that, as shown in FIG. 6C, the carbon mold 12 is set in a predetermined compression sintering apparatus (not shown), and heated and sintered there under a pressure applied onto the mixed powder 10 through the compression punch rod 13. After it is sintered, as shown in FIG. 6D, the pressure is removed, and it is cooled. Then, a sintered material 15 made by sintering the mixed powder 10 is removed from the carbon mold 12.

After that, the outer circumferential surface and top and bottom surfaces of the sintered material 15 prepared as explained above is cut approximately by 1 mm. As a result, the intended column-shaped sputtering target, containing 66 atomic % of Fe, 24 atomic % of Tb, 7 atomic % of Co and 3 atomic % of Cr, and having the diameter of 127 mm and thickness of 10 mm, is obtained.

Using sputtering targets actually made in this manner, magnetic permeability thereof were measured.

For this measurement of magnetic permeability, after a sample of the size of 8×6×0.5 mm is cut out from an eroded portion of a target, its magnetism is removed by a demagnetizer (not shown). After that, setting the sample in position of a vibration sample magnetometer (VSM), a magnetic field is applied to have a magnetic curve drawn. After that, a tangential line is drawn along the initial portion of the magnetic curve, value of the Y axis relative to a coercive force is read, and value of the magnetic permeability is calculated.

As a result of the measurement of magnetic permeability by the VSM apparatus, the target prepared by the manufacturing method according to the first embodiment was confirmed to have the magnetic permeability of 1.2.

Additionally, theoretic density ratio, content of oxygen and content of metal impurities were also measured. As a result, theoretic density ratio was 97%, content of oxygen was 640 ppm, content of metal impurities was 660 ppm.

Further, magneto-optical recording mediums were actually made by magnetron sputtering using the target according to the first embodiment. As a result, productivity increased to approximately 1.8 times as compared with 8 mm thick targets by the conventional technique.

As explained above, according to the first embodiment, by preparing recycled alloy powder having a magnetic permeability not larger than 2 from a used target of FeTbCoCr alloy used at least once for sputtering and a new metal with the same components by a gas atomizing method, thereafter preparing alloy powder containing 80 weight % of recycled alloy powder of FeTbCoCr alloy and not containing rare earth elements in the remainder part, and manufacturing a target from this alloy powder, it is possible to effectively use expensive rare earth elements while reducing metal contents and fabricate a target thick enough for sputtering and having a magnetic permeability controlled not to exceed 2. Therefore, the manufacturing cost of the target can be reduced, and the price of magneto-optical recording mediums manufactured by sputtering using this target can be reduced.

Next explained is a manufacturing method of a sputtering target according to the second embodiment of the invention. The used target used in the second embodiment is made of a ternary FeTbCo alloy.

In the sputtering target manufacturing method according to the second embodiment, a target of a FeTbCo alloy used at least once for magnetron sputtering and new metals of the same components (Fe, Tb, Co) are blended to contain the used target by 30 weight % or more, such as 50 weight %, for example, in the second embodiment, and an ingot is made therefrom in a vacuum melting furnace (not shown). Similarly to the first embodiment, this ingot is processed into recycled alloy powder containing rare earth alloy powder such that the content of rare earth metals in the rare earth alloy powder forming the recycled alloy powder is at least 35 weight %, such as 43 weight %, for example, in the second embodiment.

After that, the ingot is powdered in an inactive gas atmosphere by a gas atomizing process to prepare recycled alloy powder of FeTbCo alloy. Magnetic permeability of this recycled alloy powder has been confirmed to be 0.9 by measurement. The gas atomizing apparatus used for the gas atomizing process according to the second embodiment is the same as that used in the first embodiment, and its explanation is omitted here.

After that, the recycled alloy powder of FeTbCo is blended with powder of FeTbCo alloy not used before for making a target and other powder to make a predetermined target composition, and by dry mixture thereof in an Ar gas atmosphere, alloy powder for manufacturing the target is prepared. Respective materials of this alloy powder are blended such that the alloy powder contains rare earth alloy powder having a magnetic permeability not larger than 2 by at least 65 weight % and rare earth alloy powder by at least 65 weight %, or preferably by at least 70 weight %. In this second embodiment, the rare earth alloy powder is prepared such that it contains 50 weight %, for example, of recycled alloy powder including rare earth metals by 43 weight % and having the magnetic permeability of 0.9 whereas its remainder part is made of new rare earth alloy powder and powder of other materials adjusted to make a predetermined target composition and contains at least 70 weight % of rare alloy powder. As a result, mixed powder satisfying the above-indicated requirements is obtained. This mixed powder is adjusted to ensure that the target manufactured from this mixed powder contains 70 atomic % of Fe, 23 atomic % of Tb and 7 atomic % of Co.

Subsequently, using the mixed powder prepared in this manner, a sintered material is made by sintering in the same process as the first embodiment. Thereafter, the outer circumferential surface and top and bottom surfaces of the sintered material 15 prepared as explained above is cut approximately by 1 mm. As a result, the intended column-shaped sputtering target, containing 70 atomic % of Fe, 23 atomic % of Tb and 7 atomic % of Co, for example, and having the diameter of 127 mm and thickness of 12 mm, is obtained.

As a result of the measurement of magnetic permeability of the sputtering target in the same manner as the first embodiment, its magnetic permeability was confirmed to be 1.8. Measurement was conducted also about its theoretic density ratio, content of oxygen and content of metal impurities. As a result, theoretic density ratio was 97%, content of oxygen was 630 ppm, content of metal impurities was 660 ppm.

As explained above, according to the second embodiment, since the sputtering target having a magnetic permeability not higher than 2 can be made, the same effects as those of the first embodiment can be obtained.

That is, numerical values indicated in the above description of the embodiments are not but mere examples, and other appropriate numerical values may be used if so desired.

For example, in the first embodiment, although FeTb-CoCr is used as a quaternary rare earth alloy, any other appropriate rare earth alloy such as FeGdCoSi can be used.

In the second embodiment, although FeTbCo is used as a ternary rare earth alloy, FeTbCr, FeGdCo or FeDyCo may be used alternatively.

As described above, according to the invention, since the sputtering target is made of alloy powder which contains at least one kind of rare earth alloy powder made of at least one kind of rare earth element and at least two kinds of elements selected from the group consisting of Fe, Co, Ni, Cr and Si, and contains at least one kind of recycled alloy powder prepared from a target used at least once for sputtering, it is possible to effectively use expensive rare earth elements and reduce its manufacturing cost while reducing adverse affection to the environment. Additionally, since a sputtering target more reduced in magnetic permeability and having a larger thickness can be obtained, the price of magneto-optical recording mediums can be reduced.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A method for manufacturing a sputtering target, the method comprising:

presenting an alloy powder which contains at least 65 weight percent of at least one rare earth alloy powder, wherein the at least one rare earth alloy powder comprises at least one rare earth element, at least two elements selected from the group consisting of Fe, Co, Ni, Cr and Si, and at least one recycled alloy powder prepared by using a target used at least once for sputtering;

melting the alloy powder; and atomizing the melted alloy powder, wherein the alloy powder includes no more than 0.1 weight percent metal impurities from a crushing member.

2. The method of claim 1 wherein the alloy powder contains not less than 70 weight percent of the rare earth alloy powder.

3. The method of claim 1 wherein the alloy powder contains not less than 50 weight percent of a rare earth alloy powder having a magnetic permeability, wherein the magnetic permeability cannot be higher than 2.

4. The method of claim 3 wherein the rare earth alloy powder having a magnetic permeability that cannot be higher than 2 contains not less than 35 weight percent of at least one rare earth element.

5. The method of claim 1 wherein the alloy powder comprises a magnetic permeability that cannot be higher than 2.

6. The method of claim 1 wherein the alloy powder contains not less than 30 weight percent of the at least one recycled alloy powder.

7. The method of claim 1 wherein atomizing the alloy powder includes melting an ingot formed from the alloy powder.

8. The method of claim 7 wherein atomizing the alloy comprises a gas atomizing process.

9. The method of claim 1 wherein the at least one rare earth element is selected from the group consisting of Tb, Gd, Dy, Sm, Nd, La, and Y.

* * * * *